(12) United States Patent
Sung

(10) Patent No.: US 6,777,354 B2
(45) Date of Patent: Aug. 17, 2004

(54) SEMICONDUCTOR DEVICE AND METHOD OF MANUFACTURING THE SAME

(75) Inventor: Chae Gee Sung, Miyagi-ken (JP)

(73) Assignee: LG Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/644,712

(22) Filed: Aug. 20, 2003

(65) Prior Publication Data

US 2004/0038463 A1 Feb. 26, 2004

Related U.S. Application Data

(62) Division of application No. 09/484,672, filed on Jan. 18, 2000, now Pat. No. 6,639,279.

(30) Foreign Application Priority Data

Jan. 18, 1999 (JP) .............................. 11-009782

(51) Int. Cl.[7] .................. H01L 21/31; H01L 21/469; H01L 21/84
(52) U.S. Cl. .................. 438/792; 438/151; 438/788
(58) Field of Search ................. 438/151, 787, 438/788, 791, 792

(56) References Cited

U.S. PATENT DOCUMENTS

| | | |
|---|---|---|
| 3,745,647 A | 7/1973 | Boleky, III |
| 5,328,861 A | 7/1994 | Miyakawa |
| 5,440,168 A | 8/1995 | Nishimura et al. |
| 5,508,532 A | 4/1996 | Teramoto |
| 5,620,910 A | 4/1997 | Teramoto |
| 5,726,087 A | 3/1998 | Tseng et al. |
| 5,733,844 A * | 3/1998 | Suto et al. ........... 503/227 |
| 5,773,325 A | 6/1998 | Teramoto |
| 5,817,549 A | 10/1998 | Yamazaki et al. |
| 5,880,519 A | 3/1999 | Bothra et al. |
| 5,894,151 A | 4/1999 | Yamazaki et al. |
| 5,907,183 A | 5/1999 | Takeuchi |
| 5,998,838 A | 12/1999 | Tanabe et al. |
| 6,018,182 A | 1/2000 | Morosawa |
| 6,020,606 A | 2/2000 | Liao |
| 6,118,151 A | 9/2000 | Tsutsu |
| 6,130,422 A | 10/2000 | Bawolek et al. |
| 6,150,286 A * | 11/2000 | Sun et al. ........... 438/791 |
| 6,198,133 B1 | 3/2001 | Yamazaki et al. |
| 6,211,022 B1 | 4/2001 | Lin et al. |
| 6,252,296 B1 | 6/2001 | Umeda et al. |
| 6,329,229 B1 * | 12/2001 | Yamazaki et al. ...... 438/166 |
| 6,448,592 B1 | 9/2002 | Peek et al. |
| 6,482,685 B1 | 11/2002 | Chen et al. |
| 6,639,279 B1 * | 10/2003 | Sung ................. 257/347 |

* cited by examiner

*Primary Examiner*—Alexander Ghyka
(74) *Attorney, Agent, or Firm*—Brinks Hofer Gilson & Lione

(57) ABSTRACT

The present invention provides a semiconductor device capable of preventing deterioration in carrier mobility of a semiconductor layer, which is a quality of the interface between the semiconductor layer and an insulating layer, and a method of manufacturing the semiconductor device. In the semiconductor device, an interface layer is provided between a semiconductor layer made of active polycrystalline silicon and an insulating layer made of silicon oxide. The nitrogen element in silicon nitride diffuses into the semiconductor layer made of active polycrystalline silicon to compensate for lattice strain of the active polycrystalline silicon film, to satisfy the desired quality of the interface between the semiconductor layer and the insulating layer.

3 Claims, 5 Drawing Sheets

SEMICONDUCTOR DEVICE AND METHOD OF MANUFACTURING THE SAME

This application is a divisional application Ser. No. 09/484,672 filed on Jan. 18, 2000, now U.S. Pat. No. 6,639,279, entitled "Semiconductor Transistor Having Interface Layer Between Semiconductor And Insulating Layers".

BACKGROUND OF THE INVENTION

1. Field of the Invention

The present invention relates to a semiconductor device having improved interfacial quality of a semiconductor layer made of active polycrystalline silicon, and a method of manufacturing the same.

2. Description of the Related Art

An example of conventional semiconductor devices comprising a semiconductor layer made of active polycrystalline silicon is a thin film transistor having the structure shown in FIG. 5.

This thin film transistor comprises a channel forming portion 102 formed on an insulating glass substrate 101 to be held between a source region 103 and a drain region 104 formed on both sides thereof to form a semiconductor layer 112 made of active polycrystalline silicon. A gate insulating layer 106 made of silicon oxide is provided over the entire surface of the substrate 101 including the semiconductor layer 112, and a gate electrode 107 is provided opposite to the channel forming portion 102 through the gate insulating layer 106. A protecting film 108 is provided to cover the gate electrode 107 and the gate insulating layer 106, and a source electrode 110 and a drain electrode 111 are provided on the protecting film 108 to be connected to the source region 103 and the drain region 104, respectively, through contact holes 109 formed in the protecting film 108 and the gate insulating film 106.

The thin film transistor having the above-described structure has the probability that defects in the semiconductor layer are actualized in the interface between the semiconductor layer 112 and the gate insulating layer 106 to decrease carrier mobility of the semiconductor layer with increases in the gate voltage.

SUMMARY OF THE INVENTION

The present invention has been achieved for solving the above problem, and it is an object of the present invention to provide a semiconductor device capable of preventing deterioration in carrier mobility of a semiconductor layer, which is a quality of the interface between the semiconductor layer and an insulating layer, and a method of manufacturing the same.

A semiconductor device of the present invention comprises a semiconductor layer made of active polycrystalline silicon, an insulating layer made of silicon oxide, and an interface layer made of silicon nitride and provided between the semiconductor layer an the insulating layer.

The interface layer possibly compensates for lattice strain of the active polycrystalline silicon film due to the diffusion of nitrogen element of silicon nitride into the active polycrystalline silicon film, thereby satisfying desired quality of the interface between the semiconductor layer and the insulating layer. It is also possible to simultaneously compensate for interface defects of the active polycrystalline silicon layer serving as the semiconductor layer and form the interface layer.

Furthermore, in a semiconductor device, particularly, in a thin film transistor, silicon oxide used in the gate insulating layer serving as an insulating layer has excellent insulation voltage property, and thus the insulating voltage property required for the thin film transistor can also be satisfied.

The interface layer must have a thickness of 5 nm or more in order to compensate for lattice strain of the active polycrystalline silicon film due to diffusion into the active polycrystalline silicon film. With a thickness of 10 nm, the interface layer has the sufficient effect of compensating lattice strain. With a thickness of over 10 nm, the plasma processing time required for forming the interface layer is increased, and the effect of compensating lattice strain is not improved.

Therefore, the thickness of the interface layer is preferably 5 to 10 nm.

The insulating layer may have a desired thickness.

A method of manufacturing the semiconductor device of the present invention comprises processing the surface of a semiconductor layer made of active polycrystalline silicon with plasma using ammonia gas and silane gas to form an interface layer made of silicon nitride on the surface of the semiconductor layer, and processing the interface layer with plasma by using nitrous oxide and silane gas to form an insulating layer made of silicon oxide.

This method is capable of securely nitriding the surface of the active polycrystalline silicon layer by plasma processing using ammonia gas to form the interface layer having desired interfacial quality. The method can also simultaneously compensate for defects of the active polycrystalline silicon layer and form the interface layer on the surface of the active polycrystalline silicon layer.

The plasma processing using ammonia gas and silane gas is preferably performed by discharge at a frequency higher than 13.56 MHz.

This is because the gases are decomposed, and at the same time, discharge energy causing no damage to the semiconductor layer made of active polycrystalline silicon to be nitrided is obtained.

In the method of manufacturing the semiconductor device of the present invention, the plasma processing is preferably carried out by using ammonia gas and silane gas with a bias voltage applied to an insulating substrate on which the semiconductor layer is formed.

This is because diffusion of nitrogen element of the interface layer made of silicon nitride into the semiconductor layer made of active polycrystalline silicon is accelerated by applying potential energy to the semiconductor layer and the interface layer.

DESCRIPTION OF THE PREFERRED EMBODIMENT

An embodiment of the present invention will be described with reference to the drawings.

A semiconductor device in accordance with an embodiment of the present invention is described with reference to FIG. 1.

Figure 1:
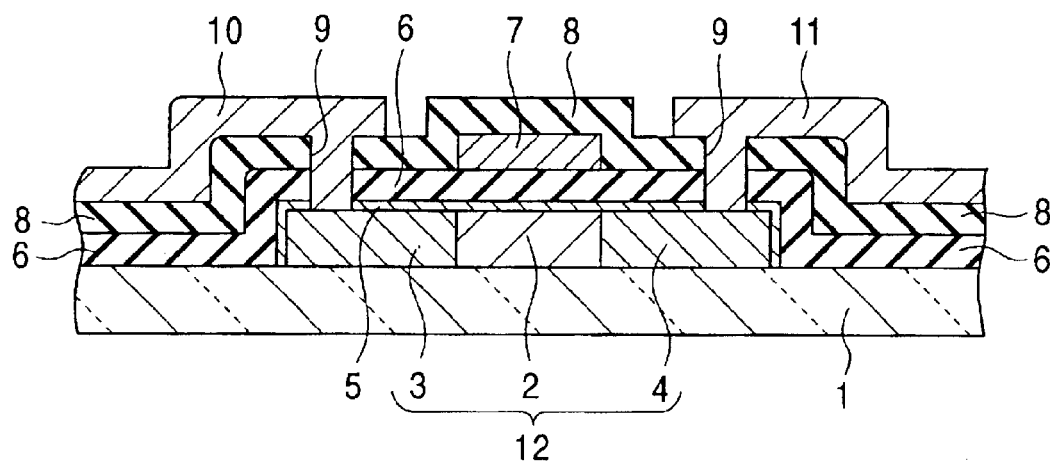
FIG. 1 is a sectional view illustrating a semiconductor device in accordance with an embodiment of the present invention.

The thin film transistor shown in FIG. 1 comprises a channel forming portion 2 formed on a transparent insulating substrate 1 made of glass or the like, and a source region 3 and a drain region 4 formed to hold both ends of the channel forming portion 2 to form a semiconductor layer 12 made of active polycrystalline silicon. The channel forming portion 2 comprises an active polycrystalline silicon containing no impurity. Each of the source region 3 and the drain region 4 comprises a low-resistance semiconductor film made of active polycrystalline silicon in which a phosphorus element is injected.

An interface layer 5 made of silicon nitride is provided on the surface of the semiconductor layer 12. A gate insulating layer 6 made of silicon oxide is provided on the semiconductor layer 12 and the substrate 1 including the interface layer 5. A gate electrode 7 is provided opposite to the channel forming portion 2 through the interface layer 5 and the gate insulating layer 6. As the material for forming the gate electrode 7, a metal having a low resistance value, such as aluminum, copper, or the like, is preferably used for preventing wiring delay due to the electric resistance of wiring.

A source electrode 10 and a drain electrode 11 are connected to the source region 3 and the drain region 4, respectively. The source electrode 10 and the drain electrode 11 are preferably composed of chromium, molybdenum tungsten, or the like, in order to obtain good connection with a $n^+$ polycrystalline silicon film. The source electrode 10 and the drain electrode 11 are connected to the source region 3 and the drain region 4, respectively, through contact holes 9 formed in the gate insulating layer 6, the interface layer 5, and a protecting film 8 formed on the gate electrode 7.

A method of manufacturing a semiconductor device in accordance with another embodiment of the present invention will be described below.

Figure 2A:
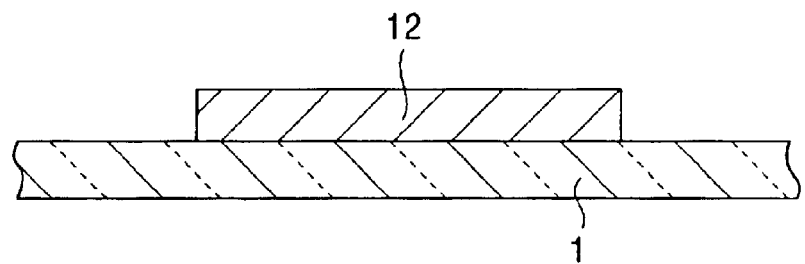
FIG. 2 is a sectional view illustrating the steps for manufacturing a semiconductor device in accordance with an embodiment of the present invention.

An amorphous silicon film is deposited on an insulating substrate 1 by plasma deposition using hydrogen gas and silane gas, and then crystallized by laser annealing to form an active polycrystalline silicon film. A semiconductor layer 12 is formed on the active polycrystalline silicon film by photolithography and etching, as shown in FIG. 2A.

Figure 2B:
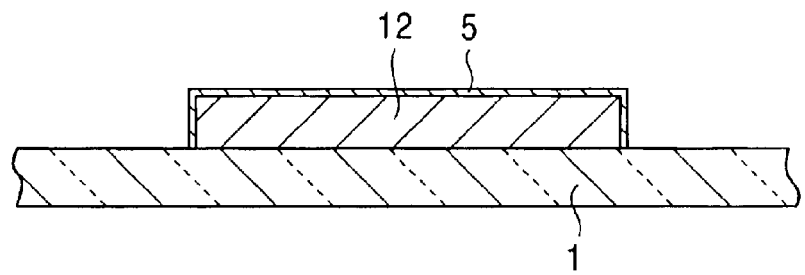

The surface of the semiconductor layer 12 is covered with an interface layer 5 made of silicon nitride by plasma nitriding, as shown in FIG. 2B.

Figure 4:
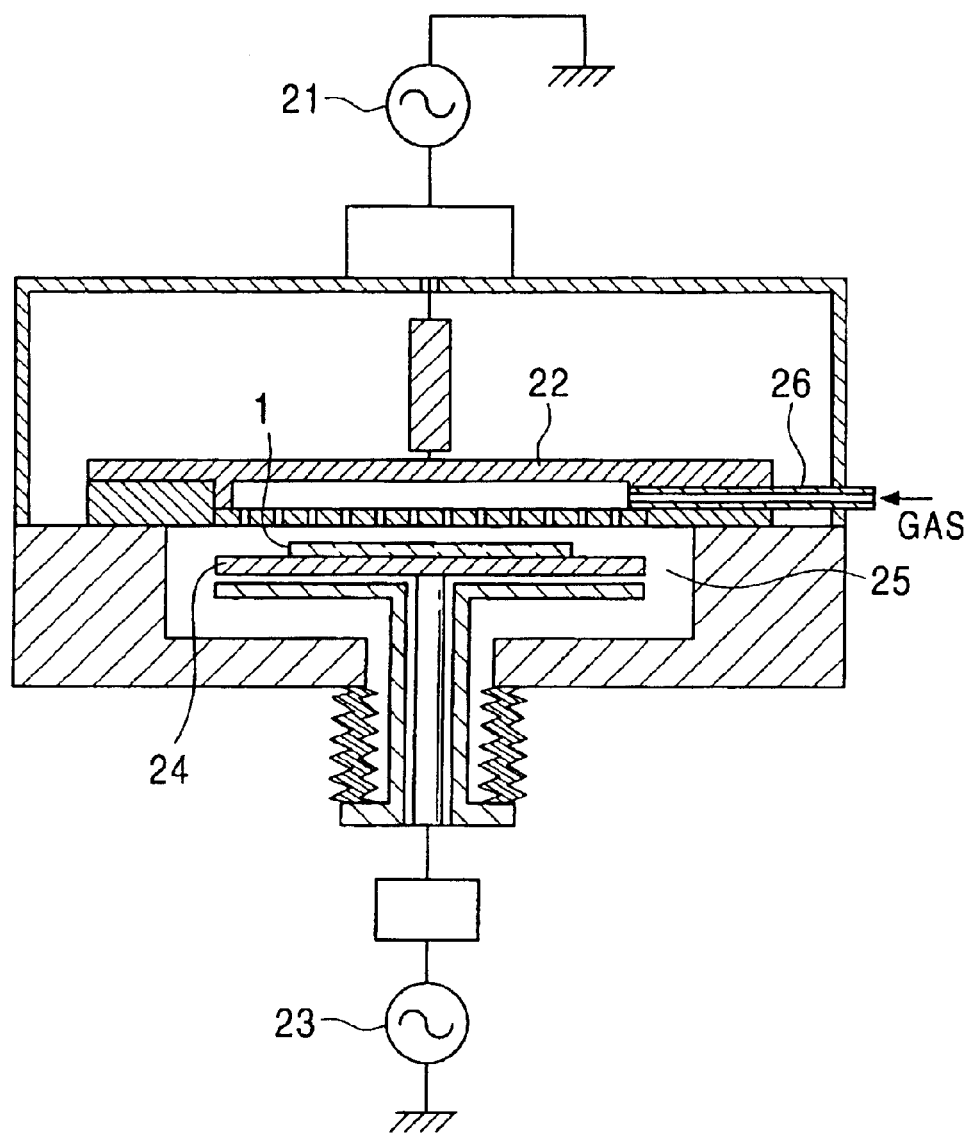
FIG. 4 is a sectional view illustrating a plasma processing apparatus used in an embodiment of the present invention.

The plasma nitriding is carried out by using the plasma processing apparatus shown in FIG. 4. The plasma processing is performed with high-frequency power at a frequency of 40 MHz supplied to a plasma excitation electrode 22, and high-frequency power of 13.56 MHz supplied to the substrate 1 to be processed with plasma, which is supported by a susceptor electrode 24.

In FIG. 4, reference numeral 21 denotes a plasma excitation power source; reference numeral 22, the plasma excitation electrode; reference numeral 23, a bias power source; reference numeral 24, the susceptor electrode.

Figure 2C:
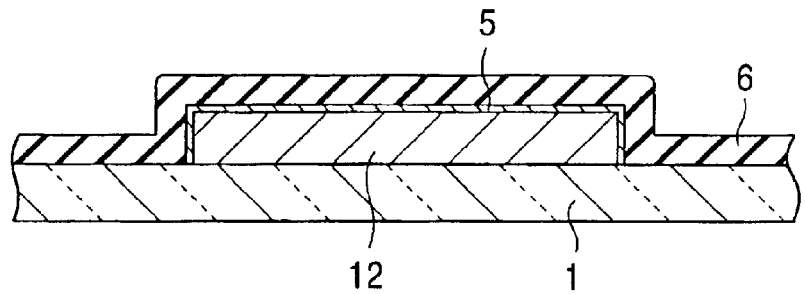

Subsequent to the plasma nitriding, a gate insulating layer 5 made of silicon oxide is deposited over the entire surface of the substrate 1 to cover the nitrided semiconductor layer 12 by continuous plasma CVD deposition in the same plasma processing apparatus, as shown in FIG. 2C.

The plasma processing is carried out in a mixed gas atmosphere containing monosilane gas and nitrous oxide gas as main components with high-frequency power at a frequency of about 100 MHz supplied to the plasma excitation electrode 22, and high-frequency power at a frequency of 50 kHz to 1.6 MHz supplied to the substrate 1.

Figure 2D:
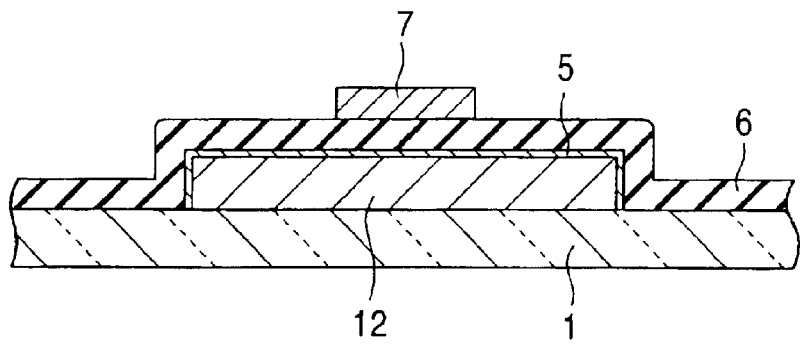

A semiconductor film serving as a gate electrode is deposited on the gate insulating layer 6 by sputtering deposition, and then unnecessary portions are removed by photolithography and etching to form a gate electrode 7, as shown in FIG. 2D.

Figure 3E:
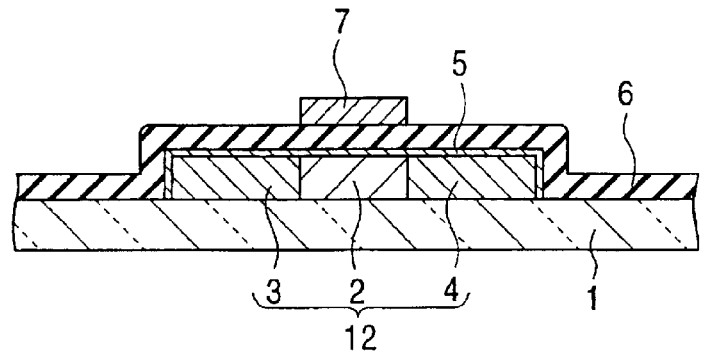
FIG. 3 is a sectional view illustrating the manufacturing steps after the steps shown in FIG. 2.

Then, an impurity ion of phosphorus, arsenic, or the like is injected into the semiconductor layer 12 from above using the gate electrode 7 as a mask to form a source region 3 and a drain region 4 comprising a $n^+$ silicon layer in regions of the semiconductor layer 12 excluding the region below the gate electrode 7, as shown in FIG. 3E. The central region of the semiconductor layer 12 into which no impurity ion is injected severs as a channel forming portion 2.

Figure 3F:
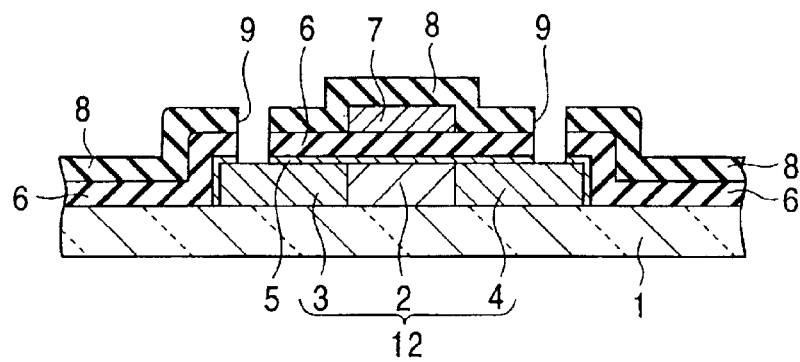
Figure 3G:
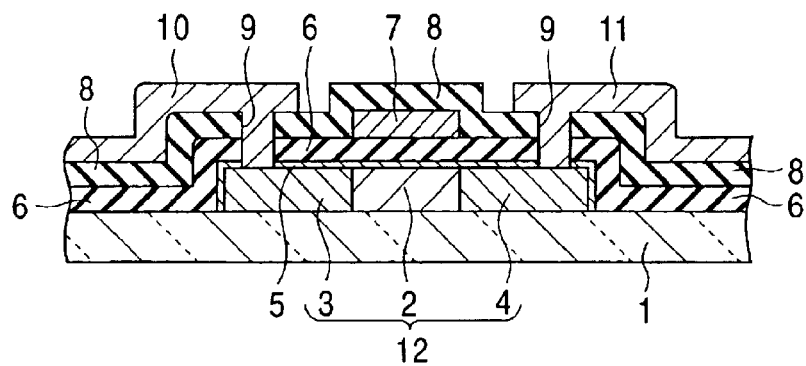

A protecting film 8 comprising an insulating film is deposited over the entire surface, and the protecting layer 8, the gate insulating layer and the interface layer 5 made of silicon nitride are patterned by photolithography and etching to form contact holes 9 respectively reaching the source region 3 and the drain region 4, as shown in FIG. 3F. Next, a conductor film is deposited over the entire surface and then patterned to form a source electrode 10 and a drain electrode 11, as shown in FIG. 3G. The thin film transistor shown in FIG. 1 is completed by the above-described steps.

In the semiconductor device shown in FIG. 1, carrier mobility of the channel forming portion 2 was measured. The interface layer 5 made of silicon nitride was formed as follows. The substrate 1 on which the semiconductor layer 12 made of active polycrystalline silicon was formed, as shown in FIG. 2A, was placed on the susceptor electrode 24 of the plasma processing apparatus shown in FIG. 4, in which an ammonia gas was supplied to the plasma processing chamber 25 through a gas inlet tube 26 at a flow rate of 36 1/hour.

Then, high-frequency power at a frequency of 40 MHz was supplied to the plasma excitation electrode 22 from the plasma excitation power source 21 to produce plasma. Furthermore, high-frequency power at a frequency of 13.56 MHz was applied to the susceptor electrode 24 from the bias power source 23 to perform plasma processing for 1 minute, to cover the surface of the semiconductor layer 12 with the interface layer 5 comprising silicon nitride of about 8 nm thick.

The carrier mobility of the semiconductor device having the thus-formed interface layer was about 100 $cm^2$/V·sec at a gate voltage of 5 V. The carrier mobility at a gate voltage of 15 V was slightly decreased, but substantially the same as that at a gate voltage of 5 V.

Figure 5:
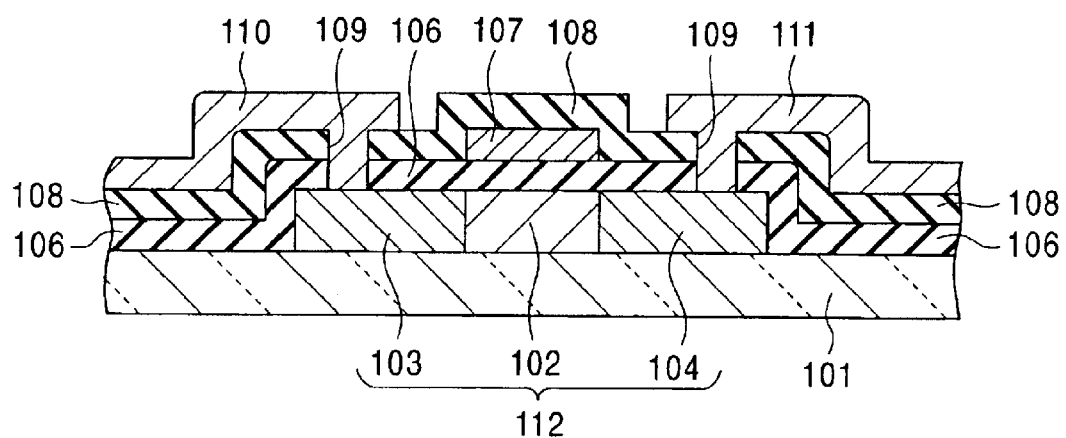
FIG. 5 is a sectional view illustrating a conventional semiconductor device.

On the other hand, a semiconductor device having the conventional structure shown in FIG. 5 was formed under the same conditions except that the interface layer was not formed, and carrier mobility of the channel forming portion 102 was measured.

The carrier mobility of the semiconductor device having the conventional structure was 100 $cm^2$/V·sec at a gate voltage of 5 V. However, the carrier mobility at a gate voltage of 15 V was significantly decreased as compared with that at a gate electrode 5V.

As described above, the present invention can provide a semiconductor device capable of preventing deterioration in carrier mobility of a semiconductor layer, which is a quality of the interface between the semiconductor layer and an insulating layer.

The manufacturing method of the present invention can manufacture a semiconductor device having the above-described interfacial quality.

What is claimed is:

1. A method of manufacturing a semiconductor device comprising:

processing the surface of a semiconductor layer made of active polycrystalline silicon with plasma by using an ammonia gas and silane gas to form an interface layer made of silicon nitride on the surface of the semiconductor layer; and processing the interface layer with plasma by using a nitrous gas and silane gas to form an insulating layer made of silicon oxide on the interface layer.

2. A method of manufacturing a semiconductor device according to claim 1, wherein the plasma processing using an ammonia gas and silane gas is performed by discharge at a frequency higher than 13.56 MHz.

3. A method of manufacturing a semiconductor device according to claim 1, wherein the plasma processing is performed by using a ammonia gas and silane gas with a bias potential applied to an insulating substrate on which the semiconductor layer is formed.

* * * * *